United States Patent
Kawano et al.

(10) Patent No.: US 8,237,048 B2
(45) Date of Patent: Aug. 7, 2012

(54) MULTILAYER ORGANIC SOLAR CELL

(75) Inventors: Kenji Kawano, Sakai (JP); Norihiro Ito, Hirakata (JP)

(73) Assignee: Panasonic Corporation, Osaka (JP)

( * ) Notice: Subject to any disclaimer, the term of this patent is extended or adjusted under 35 U.S.C. 154(b) by 784 days.

(21) Appl. No.: 11/817,597

(22) PCT Filed: Mar. 3, 2006

(86) PCT No.: PCT/JP2006/304107
§ 371 (c)(1),
(2), (4) Date: Aug. 31, 2007

(87) PCT Pub. No.: WO2006/093275
PCT Pub. Date: Sep. 8, 2006

(65) Prior Publication Data
US 2009/0301556 A1    Dec. 10, 2009

(30) Foreign Application Priority Data

Mar. 4, 2005  (JP) ................................ 2005-061364

(51) Int. Cl.
*H01L 31/00* (2006.01)
(52) U.S. Cl. ........................................ 136/256; 136/263
(58) Field of Classification Search .................. None
See application file for complete search history.

(56) References Cited

U.S. PATENT DOCUMENTS

| | | |
|---|---|---|
| 5,797,998 A | 8/1998 | Wenham et al. |
| 6,198,091 B1 | 3/2001 | Forrest et al. |
| 6,352,777 B1 | 3/2002 | Bulovic et al. |
| 6,559,375 B1 | 5/2003 | Meissner et al. |
| 2002/0119297 A1 | 8/2002 | Forrest et al. |
| 2003/0042846 A1* | 3/2003 | Forrest et al. .................. 313/503 |
| 2003/0127967 A1 | 7/2003 | Tsutsui et al. |
| 2005/0156197 A1 | 7/2005 | Tsutsui et al. |
| 2005/0224113 A1* | 10/2005 | Xue et al. ....................... 136/263 |

(Continued)

FOREIGN PATENT DOCUMENTS

JP            61-196583            8/1986

(Continued)

OTHER PUBLICATIONS

English Language Abstract of JP 2004-335737.

(Continued)

*Primary Examiner* — Jonathan Johnson
*Assistant Examiner* — Shannon Gardner
(74) *Attorney, Agent, or Firm* — Greenblum & Bernstein, P.L.C.

(57) ABSTRACT

Disclosed is a multilayer organic solar cell having a structure wherein an inter-layer (3) is arranged between a first photoactive layer (1) and a second photoactive layer (2). This structure is obtained by forming the inter-layer (3) on the first photoactive layer (1) which is formed from an organic compound solution containing a donor material and an acceptor material, and then applying an organic compound solution containing a donor material and an acceptor material over the inter-layer (3) for forming the second photoactive layer (2). The inter-layer (3) is composed of at least either of a transparent oxide and a transparent nitride. By having such a structure, the inter-layer (3) prevents the solvent in the solution for the second photoactive layer (2) from permeating into the first photoactive layer (1) when the second photoactive layer (2) is formed over the first photoactive layer (1) by applying the solution. Consequently, the first photoactive layer (1) is prevented from destruction or deterioration in functions.

13 Claims, 1 Drawing Sheet

U.S. PATENT DOCUMENTS

2006/0091797 A1    5/2006    Tsutsui et al.

FOREIGN PATENT DOCUMENTS

| JP | 62-229971   | 10/1987 |
| JP | 7-263722    | 10/1995 |
| JP | 8-31616     | 2/1996  |
| JP | 9-306554    | 11/1997 |
| JP | 9-511102    | 11/1997 |
| JP | 2001-319698 | 11/2001 |
| JP | 2002-523904 | 7/2002  |
| JP | 2002-531958 | 9/2002  |
| JP | 2003-264085 | 9/2003  |
| JP | 2003-298152 | 11/2003 |
| JP | 2004-335737 | 11/2004 |
| WO | WO 00/11725 | * 3/2000 |

OTHER PUBLICATIONS

English Language Abstract of JP 7-263722.

English Language Abstract of JP 61-196583.

J. Xue et al. "Asymmetric tandem organic photovoltaic cells with hybrid planar-mixed molecular heterojunctions", Applied Physics Letters, vol. 85, No. 23, pp. 5757-5759, 2004.

K. Triyana et al. "Tandem-type organic solar cells by stacking different heterojunction materials", Thin Solid Films, vol. 477, pp. 198-202, 2005;.

B. O'Regan et al. "A low-cost, high-efficiency solar cell based on dye-sensitized colloidal $TiO_2$ films", Nature, vol. 353, pp. 737-740, 1991.

P. Peumans et al. "Very-high-efficiency double-heterostructure copper phthalocyanine/$C_{60}$ photovoltaic cells", Applied Physics Letters, vol. 79, No. 1, pp. 126-128, 2001.

S. E. Shaheen et al. "2.5% efficient organic plastic solar cells", Applied Physics Letters, vol. 78, No. 6, pp. 841-843, 2001.

M. Niggemann et al. e-MRS 2003, oral presentation, 2003.

F. Padinger et al. "Effects of Postproduction Treatment on Plastic Solar Cells", Adv. Funct. Mater., vol. 13, No. 1, pp. 85-88, 2003.

P. Peumans et al. "Efficient photon harvesting at high optical intensities in ultrathin organic double-heterostructure photovoltaic diodes", Applied Physics Letters; vol. 76, No. 19, pp. 2650-2652, 2000.

A. Yakimov et al. "High photovoltage multiple-heterojunction organic solar cells incorporating interfacial metallic nanoclusters", Applied Physics Letters, vol. 80, No. 9, pp. 1667-1669, 2002.

English Language Abstract of JP 62-229971.

English Language Abstract of JP 2003-298152.

English Language Abstract of JP 2002-531958.

English Language Abstract of JP 2003-264085.

English Language Abstract of JP 9-306554.

English Language Abstract of JP 8-31616.

English Language Abstract of JP 2001-319698.

Triyana et al., "Effects of Different Materials Used for Internal Floating Electrode on the Photovoltaic Properties of Tandem Type Organic Solar Cell," *Japanese Journal of Applied Physics*, The Japan Society of Applied Physics, Tokyo, Japan, vol. 43, No. 4B, pp. 2352-2356, 2004.

Kawano et al., "High Open Circuit Voltage Stacked Bulkheterojunction Organic Solar Cells Fabricated by the Solution Processing," Organic Photovoltaics VI, *Proceedings of the SPIE*, vol. 5938, pp. 59381J-1-593811-9, 2005.

European Search Report that issued with respect to patent family member European Patent Application No. 06715190.2, dated Apr. 7, 2010.

M. Dun et al., Appl. Phys. Lett. 84 (2004) 3397-3399. (XP012061260).

E.P.O. Office Action that issued with respect to patent family member European Patent Application No. 06715190.2, mail date is Apr. 21, 2011.

* cited by examiner

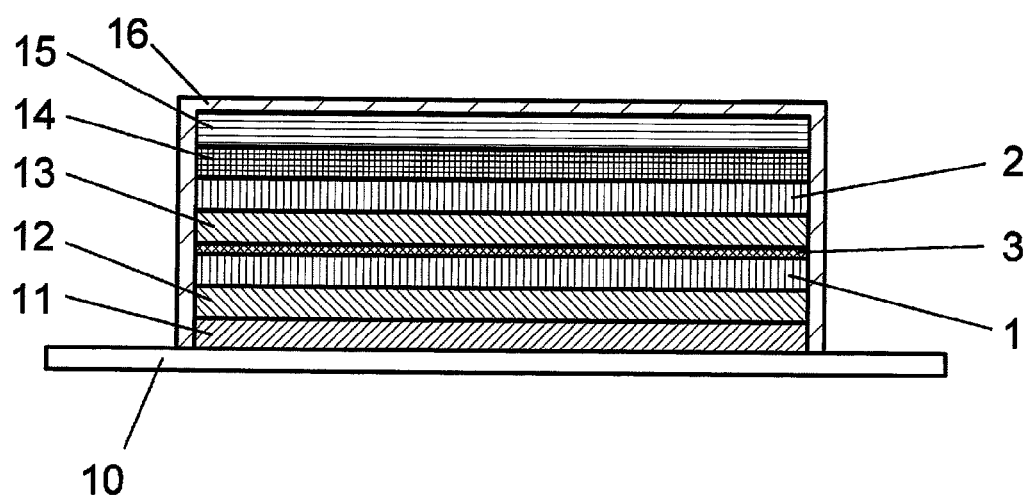

MULTILAYER ORGANIC SOLAR CELL

TECHNICAL FIELD

The present invention relates to a multilayer organic solar cell in which a plurality of photoactive layers which receive light and generate electric power are stacked to each other.

BACKGROUND ART

In recent years, energy consumption has dramatically increased with growth of industries. In the future, further increase in demand for energy is expected. Against this backdrop, today's demands are placed on the development of production technology of economic and high-performance clean energy which does not put loads the Earth's environment. Among all, a solar cell which utilizes unlimited sunlight has attracted attention as a new energy source. Most of commercialized solar cells are inorganic solar cells using single crystal silicon, polycrystal silicon or amorphous silicon. However, since these inorganic silicon-based solar cells are produced in complicated processes at high costs, the solar cells have not widespread among ordinary households. To solve such drawbacks, an organic solar cell using organic materials which achieves lower costs and large dimensions in simple processes has actively researched.

In research of such organic solar cells, Professor Gratzel of Universite de Lausanne in Switzerland discloses a dye-sensitized solar cell as a kind of organic solar cell based on photochemical reaction using porous titanium oxide, ruthenium pigment, iodine and iodine ion, which has high conversion efficiency of 10% (B. O'Regan, M. Gratzel, Nature, 353, 737 (1991)).

Concerning an organic thin film solar cell as another kind of organic solar cell, it is reported that a low-molecular organic thin film solar cell which is formed using an electron-donating material (donor material) and an electron-accepting material (acceptor material) as low-molecular materials according to a vacuum evaporation method achieves conversion efficiency of 3.6% (P. Peumans and S. R. Forrest, Appl. Phys. Lett. 79, 126 (2001)).

Use of a polymeric material for a photoactive layer which receives light and generates electric power has been considered. In this case, since the costly vacuum evaporation method is not used for forming the photoactive layer, further reduction in costs can be expected.

It is reported that a mixed film of a conjugated polymer and a fullerene derivative achieves conversion efficiency of 2.5% (S. E. Shaheen, Appl. Phys. Lett. 78, 841 (2001)). With this as a turning point, research of the organic solar cell attracts attention again and various ideas are devised to obtain an organic solar cell having high efficiency.

For example, the following ideas are devised. Irregularity is made on a backside cathode for collecting electrons to improve confinement of light and collection of electrons (M. Niggemann, e-MRS 2003, oral presentation (2003)). Alternatively, by preparing an organic solar cell using a material having high hall mobility as a conjugated polymer and then properly humidifying the organic solar cell, rearrangement of the conjugated polymer and proper mixed state of a hall transport material and an electron transport material are achieved, thereby improving charge separation (F. Padinger, Adv. Funct. Mater. 13, 85 (2003)). Conversion efficiency of 3.5% is obtained according to the above-mentioned techniques.

In addition, to improve efficiency of the organic thin film solar cell, stack of photoactive layers has been actively addressed. In the organic thin film solar cell using a low-molecular material, by separating functions by layer, providing a Wiston-type light collection structure on a glass substrate on the incident light side (P. Peumans, V. Bulovic and S. R. Forrest, Appl. Phys. Lett. 76, 2650 (2000)) or stacking photoactive parts with a metal layer of about 0.5 to 5 nm being interposed (A. Yakimov and I. R. Forrest, Appl. Phys. Lett. 80, 1667 (2002)), open end voltage (Voc) is substantially doubled. Also in the case of using a polymeric material, a plurality of photoactive layers are stacked. As described above, stack of photoactive layer is demonstrated to be one of the most effective techniques for improving efficiency of the organic thin film solar cell.

However, in the case where the photoactive layer is formed by being coated with a solution of an organic compound containing a donor material and an acceptor material, when a second photoactive layer is stacked to a first photoactive layer, the first photoactive layer may melt due to a solvent for forming the second photoactive layer, thereby causing destruction of structure of the first photoactive layer or deteriorating in functions. For this reason, it is disadvantageously difficult to form stacked structure of the photoactive layers.

Japanese Examined Patent Publication No. 8-31616 discloses a multilayer organic solar cell in which a metal layer is interposed between a plurality of photoactive layers formed according to a deposition method or the like. When the photoactive layers are formed by solution coating in this manner, by interposing the metal layer between the photoactive layers, the metal layer can prevent the solvent used for forming the second photoactive layer from penetrating into the first photoactive layer. Consequently, it is prevented from destruction of structure of the first photoactive layer or deterioration in functions due to the solvent. However, in the case where the metal layer is provided between the photoactive layers, when a thickness of the metal layer is thick, light transmittance is lowered and thus, power conversion efficiency of the solar cell is lowered. For this reason, the metal layer needs to have a very small thickness. However, when the thickness of the metal layer is decreased, the solvent is easy to penetrate into and act upon the first photoactive layer. Japanese Unexamined Patent Publication No. 2001-319698 discloses a multilayer organic solar cell in which a single cell formed of a conductive layer, an under coating layer, a photosensitive layer (photoactive layer), a charge transfer layer, a counter electrode conductive layer which are deposited in this order are stacked via a support body made of glass or the like. With such structure, since each cell can be independently formed, deterioration in forming the photoactive layer by solution coating does not occur. However, many layers and complicated structure may cause an increase in production costs and a decrease in light transmittance, leading to deterioration of power conversion efficiency of the solar cell.

SUMMARY OF THE INVENTION

An object of the present invention is to provide a multilayer organic solar cell having high power conversion efficiency in which, when a second photoactive layer is stacked over a first photoactive layer by solution coating, the first photoactive layer is prevented from destruction or deterioration in functions due to a solvent in the solution of the second photoactive layer.

To achieve the above-mentioned object, a multilayer organic solar cell in accordance with an aspect of the present invention comprises a first photoactive layer containing a donor material and an acceptor material, an inter-layer formed on the first photoactive layer, and a second photoactive layer formed of a solution of an organic compound containing the donor material and the acceptor material on the inter-layer. The inter-layer is composed of either of a transparent oxide or a transparent nitride.

In a multilayer organic solar cell in accordance with another aspect of the present invention, light transmittance of the inter-layer is 70% or higher.

In a multilayer organic solar cell in accordance with another aspect of the present invention, the inter-layer is a layer formed by coating the first photoactive layer with a solution in which particles of at least either of a transparent oxide and a transparent nitride are dispersed in a solvent which does not dissolve the first photoactive layer.

In a multilayer organic solar cell in accordance with another aspect of the present invention, the inter-layer is a layer formed according to a vapor growth method.

In a multilayer organic solar cell in accordance with another aspect of the present invention, a thickness of the inter-layer falls within a range of 5 to 250 nm.

With such configuration, the inter-layer is formed as a transparent and fine film on the first photoactive layer. Thus, when the second photoactive layer is formed by solution coating, the inter-layer prevents the solvent in the solution forming the second photoactive layer from penetrating into the first photoactive layer, thereby preventing destruction of structure of the first photoactive layer or deterioration in functions due to action of the solvent. Consequently, stacked structure of photoactive layers having high power conversion efficiency can be obtained.

BRIEF DESCRIPTION OF DRAWING

FIG. 1 is a schematic sectional view showing configuration of a multilayer organic solar cell as an example of an embodiment according to the present invention.

DETAILED DESCRIPTION OF THE INVENTION

Hereinafter, a multilayer organic solar cell in accordance with an embodiment of the present invention will be described in detail with reference to a FIGURE.

FIG. 1 shows an example of layer structure of the multilayer organic solar cell as an organic photoelectric converter. A transparent cathode layer 11, a hole transport layer 12, a photoactive layer 1 (hereinafter referred to as a first photoactive layer), an inter-layer 3, a hole transport layer 13, a photoactive layer 2 (hereinafter referred to as a second photoactive layer), an electron transport layer 14 and an anode layer 15 are deposited in this order. An outer surface of the deposited body is covered with a surface protection layer 16.

When provided on a light incident surface side of the solar cell, a support substrate 10 is formed of a material having optical transparency. The support substrate 10 may be colorless and transparent, slightly colored or formed like a ground glass. For example, a transparent glass plate made of soda-lime glass, no-alkali glass or the like and a plastic film or plate made of resin such as polyester, polyplefin, polyamide, epoxy, fluorocarbon resin or the like manufactured by using an any proper method may be used. The support substrate 10 may include particles, powders, foam or the like having a different refractive index from that of a base material for the substrate so as to have a light diffusion effect. In the case where the support substrate 10 is not provided on the light incident surface side of the solar cell, the material and so on of the solar cell are not specifically limited and only need to support the solar cell.

It is preferred that hole transport materials forming the hole transport layers 12, 13 are compounds having a hole transport capability, a hole transfer effect from the photoactive layers 1, 2, an excellent hole transfer effect to the cathode, an electron blocking characteristic and a good thin film formation capability. Specifically, available materials include phthalocyanine derivatives, naphthalocyanine derivatives, porphyrin derivatives, aromatic diamine compounds such as N,N'-bis (3-methylphenyl)-(1,1'-biphenyl)-4'-diamine (TPD) and 4,4'-bis[N-(naphthyl)-N-phenyl-amino]biphenyl($\alpha$-NPD), oxazole, oxadiazole, triazole, imidazole, imidazolone, stilbene derivatives, pyrazoline derivatives, tetrahydroimidazole, polyarylalkane, butadiene, 4,4',4"-tris(N-(3-methylphenyl)N-phenylamino)triphenylamine(m-MTDATA), and polymeric materials such as conductive polymers including polyvinylcarbazole, polysilane, aminopyrazine derivatives, polyethylenedioxythiophene (PEDOT), but are not limited to these.

A donor material for donating electrons and an acceptor material for accepting electrons are used as an organic compound forming the first photoactive layer 1 and the second photoactive layer 2. Phthalocyanine pigments, indigo, thioindigo pigments, quinacridone pigments, melocyanine compounds, cyanine compounds, squarium compounds, polycyclic aromatics, charge transfer materials used as xerographic photoreceptor, electrically conductive organic charge transfer complexes and conductive polymers may be adopted as the donor material.

Available phthalocyanine pigments include divalent metals having a central metal of Cu, Zn, Co, Ni, Pb, Pt, Fe, Mg, trivalent phthalocyanine to which a halogen atom is coordinated, such as metal-free phthalocyanine, aluminum chlorophthalocyanine, indium chlorophthalocyanine, gallium chlorophthalocyanine, and other phthalocyanines to which an oxygen atom is coordinated, such as vanadyl phthalocyanine, titanyl phthalocyanine. Available polycyclic aromatics include anthracene, tetracene, pentacene, and derivatives thereof. Available charge transfer materials include hydrazone compounds, pyrazoline compounds, triphenylmethane compounds, triphenylamine compounds. Available electrically conductive organic charge transfer complexes include tetrathiofulvalene, tetraphenyltetrathiofulvalene. The conductive polymers may include materials which is soluble in organic solvelt such as toluene, that is, poly(3-alkylthiophene), polyparaphenylenevinylene derivatives, polyfluorene derivatives, conductive polymer oligomers, but are not limited to these.

Compound semiconductor particles, especially, compound semiconductor nanocrystals can be used as the acceptor material. The nanocrystals have a size of 1 to 100 nm. The nanocrystals are formed in the shape of a rod, a ball, a tetrapod and the like. Examples of specific materials include III-V compound semiconductor crystals such as InP, InAs, GaP, GaAs, II-VI compound semiconductor crystals such as CdSe, CdS, CdTe, ZnS, oxide semiconductor crystals such as ZnO, $SiO_2$, $TiO_2$, $Al_2O_3$, CuInSe, CuInS, but are not limited to these. Low molecular materials formed of fullerene derivatives or the like and conductive polymers may be used as long as they can transport electrons.

The inter-layer 3 is composed of at least either of a transparent oxide or a transparent nitride. Examples of the transparent oxide are ITO (indium tin oxide), $SnO_2$, GZO (gallium zinc oxide), AZO (aluminium zinc oxide) and IZO (indium zinc oxide). An example of the transparent nitride is $Si_3N_4$. Any materials which can transmit light and do not deteriorate functions of the first photoactive layer 1 may be adopted and are not limited to the above-mentioned materials.

Available materials used for the electron transport layer 14 provided on the second photoactive layer 2 include bathocuproin, bathophenanthroline and derivatives thereof, silole compound, triazole compound, tris(8-hydroxyquinolinate) aluminium complex, bis(4-methyl-8-quinolinate)aluminium complex, oxadiazole compound, distyrylarylene derivatives, silole compound, TPBI (2,2',2''-(1,3,5-benzenetrile)tris-[1-phenyl-1H-benzimidazole]). However, any electron-transporting materials may be used and are not limited to these. Electron mobility of the materials is preferably $10^{-6}$ cm2/Vs or more, more preferably $10^{-5}$ cm2/Vs or more.

The anode layer 15 formed on the electron transport layer 14 is an electrode for effectively collecting electrons generated in the photoactive layers 1, 2. It is preferred that a material for the electrode is a metal, an alloy, a conductive compound or a mixture thereof having small work function of 5 eV or smaller. Examples of electrode materials for the anode layer 15 include alkali metals, alkali metal halides, alkali metal oxides, alkali earth metals, rare earth metals and alloys of these metals and other metals, such as sodium, sodium-potassium alloys, lithium, magnesium, magnesium-silver mixtures, magnesium-indium mixtures, aluminium-lithium alloys and Al/LiF mixtures. Aluminium and Al/Al2O3 mixtures may be used. The anode layer 15 may be formed by using an alkali metal oxide, an alkali metal halide or a metal oxide as a base of the anode layer 15 and laminating one or more layer of the above-mentioned materials or alloys containing these materials having work function of 5 eV or larger. Examples include a lamination layer of alkali metal/Al, a lamination layer of alkali metal halide/alkali earth metal/Al and a lamination layer of Al2O3/Al. The anode layer 15 is prepared by forming the electrode material in a shape of a thin film according to a vacuum evaporation method, a sputtering method or a similar method.

Then, the surface protection layer 16 which covers the deposited body thus formed may be formed by laminating a metal such as Al by sputtering or making fluorine-based compound, fluorine-based polymers or other organic molecule and polymers into a thin film by deposition, sputtering, CVD, plasma polymerization, coating, ultraviolet curing, thermal curing or other methods. Alternatively, a film-like structure having optical transparency and gas-barrier properties may be provided. In the case where the surface protection layer 16 is provided on the light incident surface side, it is preferred that a light transmittance of the surface protection layer 16 is 70% or higher so as to allow light to reach the photoactive layers 1, 2.

Next, formation of the photoactive layers 1, 2 and the inter-layer 3 will be described. The inter-layer 3 is formed on the first photoactive layer 1 and then, the hole transport layer 13 and the second photoactive layer 2 are formed on the inter-layer 3 in this order. The first photoactive layer 1 may be formed by dissolving or dispersing the organic compound in a solvent, applying the solvent to the hole transport layer 12 and drying it or generating the organic compound on the hole transport layer 12 by a vapor growth method. A method of forming the film is not specifically limited.

The inter-layer 3 may be formed by coating the first photoactive layer 1 with a solution in which particles of the transparent oxide or the transparent nitride are dispersed in a solvent to remove the solvent. In this case, it is preferred to use the solvent which prevents deterioration in functions, for example, does not dissolve the first photoactive layer 1. Available solvents are alcohols such as methanol, ethanol, isopropyl alcohol and water. The inter-layer 3 may be formed by the vapor growth method without using any solvent. In this case, functions of the first photoactive layer 1 are not deteriorated by the solvent. A vacuum evaporation method, a vacuum sputtering method and an EB evaporation method may be adopted as the vapor growth method. However, any method of forming the layer in vapor phase without using any solvent may be adopted and is not limited to the above-mentioned methods. A thickness of the inter-layer 3 thus formed falls within the range of 5 to 250 nm.

The second photoactive layer 2 is formed by coating the hole transport layer 13 formed on the inter-layer 3 with an organic compound containing the donor material and the acceptor material and then, removing a solvent. The above-mentioned materials may be used as the donor material and the acceptor material. A polar solvent such as chloroform, chlorobenzene, 1,2-dichlorobenzene, 1,2,4-trichlorobenzene and toluene may be used as the solvent.

With the above-mentioned structure of the multilayer organic solar cell, the inter-layer 3 formed on the first photoactive layer 1 is interposed between the first photoactive layer 1 and the second photoactive layer 2 formed by solution coating, thereby preventing the solvent in the solution from penetrating into the first photoactive layer 1 and thus preventing the solvent from acting upon the first photoactive layer 1. That is, the photoactive layer 1 is prevented from destruction or deterioration in functions due to dissolution in the solvent. Consequently, the multilayer organic solar cell thus constituted has stacked structure of photoactive layers having high power conversion efficiency.

Since the inter-layer 3 is composed of the transparent oxide or the transparent nitride, the layer can be formed as a transparent and fine film. Thus, the inter-layer 3 can ensure a light transmittance of 70% or higher in a predetermined thickness thereof. When the light transmittance of the inter-layer 3 is 70% or higher, the second photoactive layer 2 formed on the first photoactive layer 1 have high light absorption and power conversion efficiency. Light which is not absorbed but reflected as the first photoactive layer 1 is thin can be converted into electricity, thereby improving power conversion efficiency. As the light transmittance of the inter-layer 3 is higher, power conversion efficiency is improved. An upper limit is not specifically set. The predetermined thickness of the inter-layer 3 is preferably 5 to 250 nm. In the following Examples, the thickness of the inter-layer 3 falls within the range. By setting the thickness of the inter-layer 3 at 5 nm or larger, it is possible to prevent the solvent from penetrating into and acting upon the first photoactive layer 1 when the second photoactive layer 2 is formed by solvent coating. By setting the thickness of the inter-layer 3 at 250 nm or smaller, the light transmittance of 70% or higher can be obtained and internal resistance of the organic solar cell cannot be increased.

In this embodiment, the hole transport layer 13 is provided between the inter-layer 3 and the second photoactive layer 2. However, another layer may be provided as needed. The second photoactive layer 2 may be formed directly on the inter-layer 3. Also in this case, since the inter-layer 3 can block penetration of the solvent in the solution forming the second photoactive layer 2 as in the above-mentioned embodiment, the first photoactive layer 1 is prevented from destruction or deterioration in functions. Consequently, stacked structure of photoactive layers having high power conversion efficiency can be achieved.

Basically, structure of the multilayer organic solar cell is cathode layer/first photoactive layer/inter-layer/second photoactive layer/anode layer. However, specific examples of the structure include cathode layer/hole transport layer/first photoactive layer/inter-layer/hole transport layer/second photoactive layer/electron transport layer/anode layer, cathode layer/hole transport layer/first photoactive layer/inter-layer/ hole transport layer/second photoactive layer/anode layer, cathode layer/hole transport layer/first photoactive layer/inter-layer/second photoactive layer/anode layer, and cathode layer/hole transport layer/first photoactive layer/inter-layer/ second photoactive layer/electron transport layer/anode layer. In the above-mentioned structure, an electron transport layer may be provided between the first photoactive layer and the inter-layer. The structure of first photoactive layer/electron transport layer without the hole transport layer may be adopted.

Next, the present invention will be specifically described using Examples.

Example 1

A glass substrate with an ITO film (made by Kuramoto Seisakusho Co., Ltd.) which becomes the cathode layer was ultrasonic cleaned in acetone, isopropyl alcohol (made by Kanto Chemical Co., Inc.), Semico Clean (made by Furuuchi Chemical Corporation) and ultrapure water, respectively, for 10 minutes, and then, cleaned in vapor of isopropyl alcohol and dried. Next, a surface of the substrate was treated by an atmospheric pressure plasma surface treatment device (made by Matsushita Electric Works, Ltd.) for 3 minutes.

Next, polyethylenedioxythiophene:polystyrene sulfonate (made by Starck Ltd.) having a thickness of 50 nm as the hole transport layer was formed on the cathode layer made of the ITO film.

Next, the substrate was transferred to a glove box in a dry Ar atmosphere with oxygen of 1 ppm or less at a dew point of −76° C. or lower. A solution was prepared by dissolving 4 mg of poly(2-methoxy-5-(3,7-dimethyloctyloxy)-1,4-phenylenevinylene (made by American Dye Source, Inc., MDMO-PPV) as the donor material and 20 mg of [6,6]-phenylC61-butyricacid methyl ester (made by American Dye Source, Inc., abbreviated as PCBM) which is a fullerene derivative as the acceptor material in 1 mL of chlorobenzene. The first organic photoactive layer having a thickness of 100 nm was formed by coating the hole transport layer with the solution by spin coating.

Next, the substrate was transferred to a DC sputtering device (made by Anelva Corporation). Using a ITO ceramic target (Tosoh Corporation), an ITO thin film having a thickness of 20 nm as the inter-layer was formed on the first organic photoactive layer so as not to damage to the first organic photoactive layer.

Next, similarly, the hole transport layer was formed on the inter-layer, and as in the case of the first organic photoactive layer, the second organic photoactive layer was formed on the hole transport layer by solution coating through spin coating.

Next, the substrate was set at a vacuum deposition device (made by ULVAC, Inc.). Bathocuproin (made by DOJINDO LABORATORIES) having a thickness of 6 nm as the electron transport layer was formed on the second organic photoactive layer. An Al thin film having a thickness of 150 nm as a counter electrode anode layer was formed on the electron transport layer according to the vacuum evaporation method.

Next, the ITO substrate formed of the deposited layers was transferred to a a glove box in a dry nitrogen atmosphere at a dew point of −76° C. or lower without being exposed to the air. Meanwhile, barium oxide powders as water absorption were placed in a perforated bag and the bag was attached to a glass sealing plate with an adhesive. A sealing agent made of ultraviolet curing resin was previously applied to an outer circumference of the sealing plate and the ITO substrate and the sealing plate are stuck together with the sealing agent in the glove box and the sealing agent was cured by UV to form the surface protection layer. As described above, the multilayer organic solar cell as the organic photoelectric converter having the layer structure as shown in FIG. 1 was obtained.

Example 2

ITO ultrafine particles each having a diameter of 5 to 20 nm were dispersed in isopropyl alcohol at a concentration of 20 mg/mL to obtain a solution. An ITO film having a thickness of 200 nm as the inter-layer was formed on the first organic photoactive layer by spin coating of the solution. Except for these steps, the same processing as that in Example 1 was carried out to obtain a multilayer organic solar cell.

Comparative Example 1

By sputtering an Ag metal target with a sputtering device as in Example 1, a Ag film having a thickness of 20 nm as the inter-layer was formed on the first organic photoactive layer. Except for these steps, the same processing as that in Example 1 was carried out to obtain a multilayer organic solar cell.

Comparative Example 2

By sputtering an Ag metal target with a sputtering device as in Example 1, a Ag film having a thickness of 5 nm as the inter-layer was formed on the first organic photoactive layer. Except for these steps, the same processing as that in Example 1 was carried out to obtain a multilayer organic solar cell.

Light transmittance (light transmittance in visible light having a wavelength of 500 nm) and conversion efficiency in the case where artificial sunlight (AM1.5, 1sun) was applied to the multilayer organic solar cells obtained in Examples 1, 2 and Comparative examples 1, 2 by a solar simulator (made by Yamashita Denso Corporation) were acquired. Table 1 shows results.

TABLE 1

| | Inter-layer Material | Inter-layer Thickness | Light Transmittance @500 nm | Open End Electrode |
|---|---|---|---|---|
| Example 1 | ITO | 20 nm | 92% | 1.2 V |
| Example 2 | ITO | 200 nm | 90% | 1.1 V |
| Comparative example 1 | Ag | 20 nm | 55% | 0.7 V |
| Comparative example 2 | Ag | 100 nm | 73% | 0.7 V |

As shown in Table 1, the multilayer organic solar cell in each Example has higher light transmittance, open end voltage and power conversion efficiency than the multilayer organic solar cell in each Comparative example.

The present invention has been described in detail using the embodiment with reference to the appended FIGURE. However, it would be apparent for those skilled in the art that various modifications and changes could be made. Thus, it should be recognized that such modifications and changes do not deviate from the scope of the present invention but fall within the scope.

This application is based on Japanese Patent Application No. 2005-061364 and contents of the patent application should be incorporated into the present invention by reference of specification and figures thereof.

The invention claimed is:

1. A multilayer organic solar cell comprising:
a first photoactive layer containing a donor material and an acceptor material;
an inter-layer formed on the first photoactive layer; and
a second photoactive layer formed of a solution of an organic compound containing the donor material and the acceptor material of the same kind as the first photoactive layer on the inter-layer, wherein
a hole transport layer is formed between the inter-layer and the second photoactive layer, and
the inter-layer is composed of either of a transparent oxide or a transparent nitride and is within a single cell having the first photoactive layer and the second photoactive layer.

2. The multilayer organic solar cell as stated in claim 1, wherein light transmittance of the inter-layer is 70% or higher.

3. The multilayer organic solar cell as stated in claim 1, wherein the inter-layer is a layer formed by coating the first photoactive layer with a solution in which particles of at least either of a transparent oxide and a transparent nitride are dispersed in a solvent which does not dissolve the first photoactive layer.

4. The multilayer organic solar cell as stated in claim 1, wherein the inter-layer is a layer formed according to a vapor growth method.

5. The multilayer organic solar cell as stated in claim 1, wherein a thickness of the inter-layer falls within a range of 5 to 250 nm.

6. The multilayer organic solar cell as stated in claim 2, wherein the inter-layer is a layer formed by coating the first photoactive layer with a solution in which particles of at least either of a transparent oxide and a transparent nitride are dispersed in a solvent which does not dissolve the first photoactive layer.

7. The multilayer organic solar cell as stated in claim 2, wherein the inter-layer is a layer formed according to a vapor growth method.

8. The multilayer organic solar cell as stated in claim 2, wherein a thickness of the inter-layer falls within a range of 5 to 250 nm.

9. The multilayer organic solar cell as stated in claim 3, wherein a thickness of the inter-layer falls within a range of 5 to 250 nm.

10. The multilayer organic solar cell as stated in claim 4, wherein a thickness of the inter-layer falls within a range of 5 to 250 nm.

11. The multilayer organic solar cell as stated in claim 6, wherein a thickness of the inter-layer falls within a range of 5 to 250 nm.

12. The multilayer organic solar cell as stated in claim 7, wherein a thickness of the inter-layer falls within a range of 5 to 250 nm.

13. A multilayer organic solar cell comprising, in a single cell:
a first photoactive layer containing a donor material and an acceptor material;
an inter-layer formed on the first photoactive layer; and
a second photoactive layer formed of a solution of an organic compound containing the donor material and the acceptor material of the same kind as the first photoactive layer on the inter-layer, wherein
a hole transport layer is formed between the inter-layer and the second photoactive layer, and
the inter-layer is composed of either of a transparent oxide or a transparent nitride.

* * * * *